United States Patent [19]

Higashiyama et al.

[11] Patent Number: 5,178,979
[45] Date of Patent: * Jan. 12, 1993

[54] IMAGE TRANSFERRING MEDIUM

[75] Inventors: Shunichi Higashiyama, Yokkaichi; Keiko Suzuki, Okazaki, both of Japan

[73] Assignee: Brother Kogyo Kabushiki Kaisha, Aichi, Japan

[*] Notice: The portion of the term of this patent subsequent to May 28, 2008 has been disclaimed.

[21] Appl. No.: 605,429

[22] Filed: Oct. 30, 1990

[30] Foreign Application Priority Data

Oct. 31, 1989 [JP] Japan ................. 1-283474
Feb. 20, 1990 [JP] Japan ................. 2-39398

[51] Int. Cl.$^5$ .................... G03C 11/12; G03C 1/90
[52] U.S. Cl. .................... 430/14; 430/138; 430/211; 430/235; 430/256; 430/257; 430/259; 430/262; 430/263; 503/214; 503/215; 503/226
[58] Field of Search ............. 430/211, 235, 237, 256, 430/259, 262, 263, 138, 257.14; 503/214, 215, 226

[56] References Cited

U.S. PATENT DOCUMENTS 3,721,557 3/1973 Inoue et al. .................... 430/257
4,865,938 9/1989 Sakai et al. .................... 430/138
5,019,475 5/1991 Higashiyama et al. ............. 430/138
5,043,314 8/1991 Suzuki et al. .................... 430/138

FOREIGN PATENT DOCUMENTS 2-97947 4/1990 Japan.

*Primary Examiner*—Richard L. Schilling
*Attorney, Agent, or Firm*—Oliff & Berridge

[57] ABSTRACT

An image transfer type recording method for forming a visible image on a developer medium comprising a base sheet, a thermoplastic resin layer, and a developer material layer which is color-reactable with a chromogenic material laminated in this order, and transferring the visible image on the developer medium to any type of image supporting medium, comprising the steps of forming the visible image on the developer material layer through a color-reaction between the developer material and the chromogenic material, providing an adhesive layer on the developer material layer, superposing the developer material layer and the image supporting medium under pressure and heat to fixedly transfer the developer material layer having the visible image thereon to the image supporting medium, and peeling off only the substrate of the developer medium.

9 Claims, 4 Drawing Sheets

IMAGE TRANSFERRING MEDIUM

BACKGROUND OF THE INVENTION

The present invention relates to an image transfer type recording method for recording a color image on any type of medium such as plain paper, post card, clothes, plastic film, or the like.

A photosensitive and pressure-sensitive recording system which utilizes a photosensitive and pressure-sensitive recording medium comprising a substrate coated with pressure-rupturable microcapsules mainly encapsulating a chromogenic material or dye precursor, a photo-curing resin and a photopolymerization initiator and a developer medium comprising a substrate coated with developer material which is color-reactable with the chromogenic material or dye precursor has been conventionally used in an image forming apparatus. This recording system is disclosed in detail in Japanese Unexamined Published Patent Application No. 61-173981.

In this photosensitive and pressure-sensitive recording system, light is radiated onto the surface of the photosensitive pressure sensitive recording medium in accordance with an original image information to cure the photo-curing resin. Thereafter, the exposed photosensitive and pressure-sensitive recording medium is superposed over the developer medium under pressure to rupture the uncured microcapsules. As a result, the chromogenic material or dye precursor released from the ruptured microcapsules reacts with the developer material to form a visible image on the developer medium.

The photosensitive and pressure-sensitive recording system as described above can easily form an image on the developer medium which is specially manufactured, however, it can not form the image on any type of medium such as post cards, plain paper, plastic films (PET films), cloths and the like.

In order to resolve this disadvantage, the developer medium having the visible image thereon is superposed over a heat-fusible sheet comprising a base sheet coated with thermoplastic resin such that the developer material layer of the developer medium is contacted with the thermoplastic resin layer of the heat-fusible sheet, and then the superposed medium and sheet are applied with pressure and heat to thereby transfer only the developer material layer having the visible image from the developer medium to the heat-fusible sheet. Thereafter, the heat-fusible sheet to which the developer material layer is adhered, is adhered to any type of medium, and finally the base sheet is peeled from the heat-fusible sheet to attach the developer material layer having the visible image on any type of medium.

However, this adhesive sheet peeling process may often cause the following problems when the heat-fusible sheet is separated from the developer medium to peel the developer material layer having the visible image from the developer material layer, and/or from any type of medium to peel the base sheet from the heat-fusible sheet. In the former case, although the developer material layer should be separated from the substrate of the developer medium, the base sheet of the heat-fusible sheet is more easily separated from the thermoplastic resin layer thereof. Even when the developer material layer is completely separated from the substrate by the heat-fusible sheet and adhered to any type of medium, the base sheet of the heat-fusible sheet can not be easily and completely separated from the developer material layer. Therefore, the visible image formed on the developer material layer is often spoiled.

One of further improved image transfer type recording systems is provided to resolve the above problems, for example shown in Japanese Unexamined Published Patent Application No. 1-109760 and U.S. Ser. No. 497,360 filed on Mar. 22, 1990 (which corresponds to Japanese Unexamined Published Patent Application No. 1-109760). In this improved system, a developer material layer and a thermoplastic resin layer are coated on a single base sheet to form a developer medium. A visible image is developed on the developer medium by reacting the developer material and the chromogenic material or dye precursor deposited on a photosensitive and pressure sensitive recording medium. The developer medium is then superposed over any type of medium to be finally recorded, and the superposed mediums are supplied with pressure and heat. Finally, only the base sheet of the developer medium is peeled.

This image transfer recording system can easily, quickly and completely form the developer material image on any type of medium with a single transfer process. Further this system can also eliminate the difficulties with peeling work of the heat-fusible adhesive sheet. In this system, a heat roller or an ironing means is usually employed to heat and press the visible image on the developer medium and any type of medium. The temperature of the heat source such as the heat roller depends on the melting point of the developer material per se or a binder contained in the developer medium. If the temperature is low, the visible image can not be completely formed and transferred to any type of medium. In other words, this recording system is affected by ambient conditions. Even though the transferred image is formed on any type of medium by using the heat source at a low temperature, the transferred image would be easily separated from the surface of the medium.

Almost all conventional image transfer type recording systems can not completely and clearly form the transferred image on any type of medium, especially as a cloth surface. Even if the transferred image is clearly formed on the cloth surface, the transferred image has a poor adhesion thereto. As a result, such a transferred image is easily torn and broken by scratching and the like.

SUMMARY OF THE INVENTION

The present invention has been made in view of the foregoing, and an object of the invention is to provide an image transfer type recording method which can simplify a temperature control and decrease the temperature of a heat source used to transfer the image onto any type of medium such as plain paper, post card, cloths or the like which is not specially manufactured.

Another object of the present invention is to provide an image transfer type recording method which can form a transferred image on any type of medium with excellent durability against any external force such as scratching.

Still another object of the present invention is to provide an image transfer type recording method which can decrease cost for recording the image.

In order to achieve the above and other objects, the present invention is applied to the image transfer type recording method for forming a visible image on a developer medium comprising a base sheet (or substrate), a thermoplastic resin layer and a developer material layer which is color-reactable with chromogenic material laminated in this order, and transferring the visible image on the developer medium to any type of image supporting medium, which comprises the steps of forming the visible image on the developer material layer through a color-reaction between the developer material and the chromogenic material, providing an adhesive layer on the developer material layer, superposing the developer material layer and the image supporting medium under pressure and heat to fixedly transfer the developer material layer having the visible image thereon to the image supporting medium, and peeling off only the substrate of the developer medium.

In this type of image transfer recording method, the present invention provides a step for inserting or interposing an adhesive layer between the developer material layer and an image supporting medium such as any type of medium before the image transfer step. In another aspect of the present invention, an adhesive layer is provided on the rear surface of the image supporting medium, especially cloths, after the image transfer step.

According to the former aspect of the present invention, the adhesive layer is interposed between the developer material layer of the developer medium and the surface of the image supporting medium on which the visible image is finally supported. The interposed adhesive layer makes the developer material layer and the surface of the image supporting medium firmly adhere to each other even if the pressure and heating temperature are lower than in conventional methods. After this step, the substrate is peeled from the developer medium.

According to the later aspect of the present invention, the adhesive layer is disposed on the rear surface of the image supporting medium. The adhesive layer provided at the rear surface of the image supporting medium firmly adheres to the developer material layer through the image supporting medium.

DETAILED DESCRIPTION OF THE PREFERRED EMBODIMENTS

Preferred embodiments of the present invention will be described with reference to the accompanying drawings.

Figure 1:
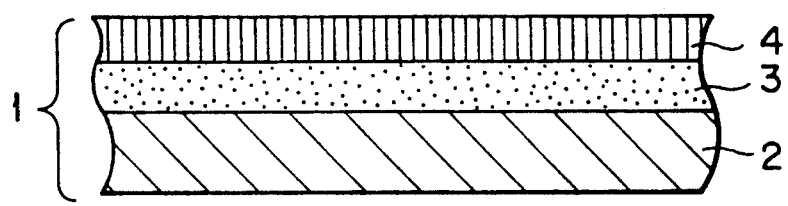
FIG. 1 is a cross-sectional view showing the transfer type developer medium used in the first embodiment.

In an image forming method of this invention, a transfer type of developer sheet as shown in FIG. 1 and a microcapsule sheet 10 are representatively used as a developer medium and as a photosensitive and pressure-sensitive recording medium, respectively. The developer sheet 1 basically comprises a substrate 2, a thermoplastic resin layer 3 and a developer material layer 4 which are laminated in this order, and the microcapsule sheet 10 comprises a substrate 12 coated with microcapsules 11.

A first embodiment of the present invention is shown in FIGS. 1 to 6, and an image forming process including a developer material layer transferring process of this embodiment will be described hereunder.

Figure 2:
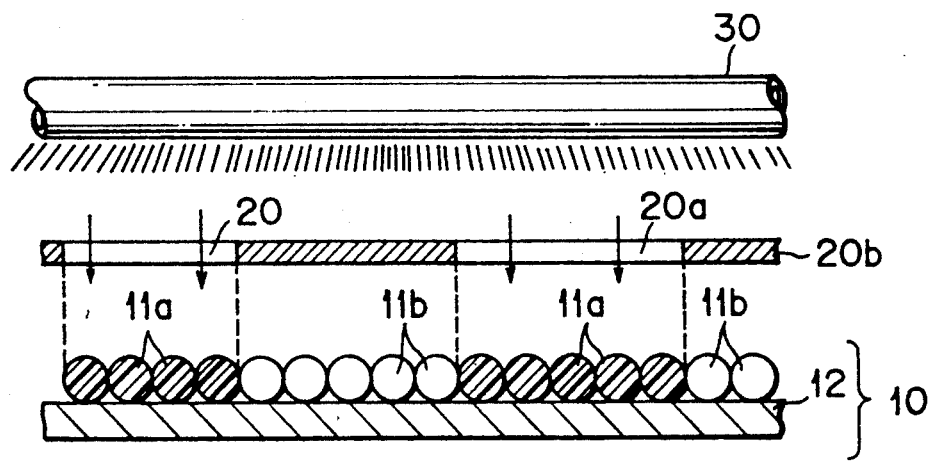
FIG. 2 is a schematic view showing an exposure process for exposing a photosensitive and pressure-sensitive recording medium to light.
Figure 3:
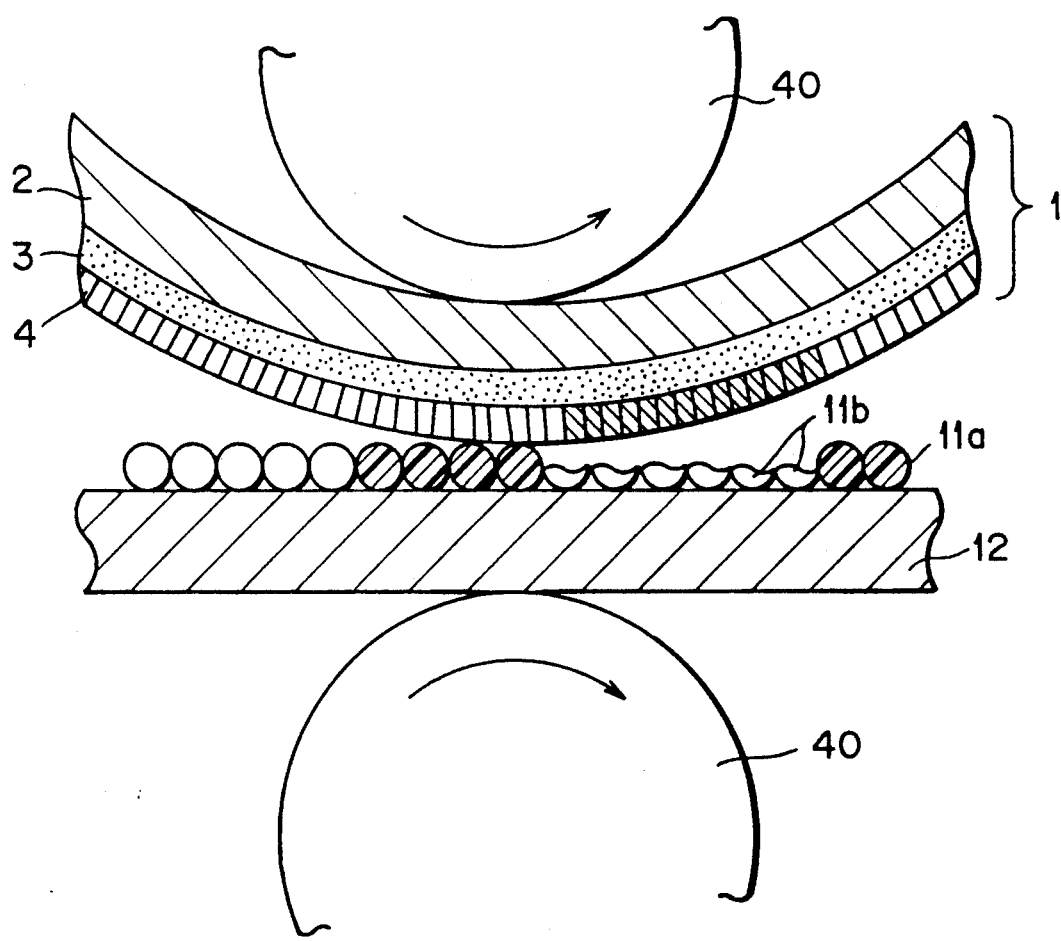
FIG. 3 is a schematic view showing a pressure-developing process for superposing a developer medium and the photosensitive and pressure sensitive recording medium over each other under pressure.

First, a latent image is formed on the photosensitive and pressure-sensitive recording medium 10 as follows. First, light emitted from a lamp 30 is irradiated onto the photosensitive and pressure-sensitive recording medium 10 through an original 20 as shown in FIG. 2. The light is only passed through the transparent area 20a of the original 20 and thus only microcapsules 11a on the recording medium 10 under the transparent area 20a are exposed to the light to thereby cure the exposed microcapsules 11a. Thereafter, as shown in FIG. 3, the exposed surface of the photosensitive and pressure-sensitive recording medium 10 is superposed over the developer medium 1 and the superposed mediums 1 and 10 are supplied with pressure by means of a pair of pressure rollers 40, so that only the uncured microcapsules 11b on the recording medium 10 are ruptured to release the chromogenic material encapsulated in the ruptured microcapsules 11b onto the developer material layer 4. The chromogenic material and the developer material are color-reacted to develop the latent image on the recording medium 10 into a visible image corresponding to the original image on the developer medium 1.

Next, the transferring process for transferring the visible image on the developer medium 1 to any type of medium 5 will be described with reference to FIGS. 1, 5 and 6.

Figure 4:
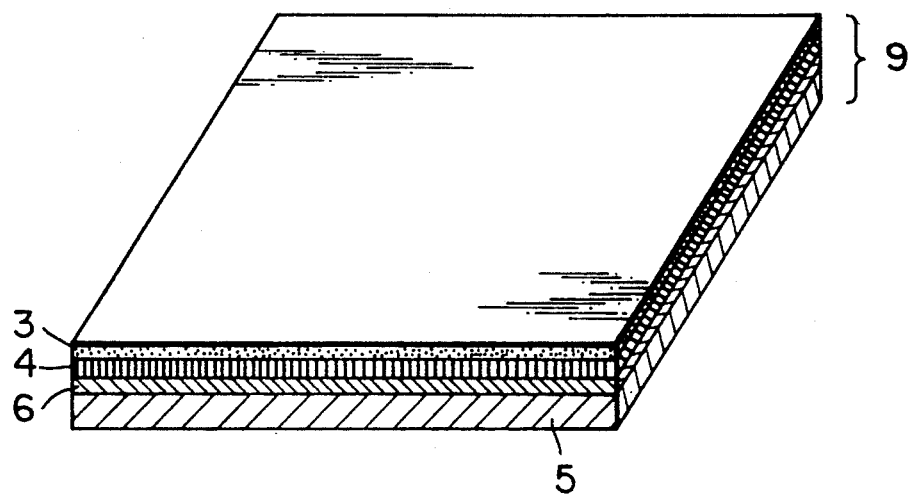
FIG. 4 is a schematically perspective view showing the transfer type developer medium and any type of medium which are adhered through an adhesive layer to each other according to a first embodiment of the present invention.

The transferring process of this embodiment is carried out by forming an image transfer product 9 as shown in FIG. 4 in which the adhesive layer 6 is interposed between the developer material layer having the visible image and any type of medium 5. This product is formed by various manners, and of these manners an adhesive sheet 8 as shown in FIG. 5 may be preferably used to form this construction.

The adhesive sheet 8 includes a base sheet 7 and an adhesive layer 6 formed on the base sheet 7. The developer medium 1 is superposed on the adhesive sheet 8 such that the developer material layer 4 of the developer medium 1 is contacted with the adhesive layer 6 of the adhesive sheet 8, and they are supplied with pressure and heat, whereby the adhesive layer 6 is softened to adhere to the developer material layer 4. Thereafter, the base sheet 7 is peeled from the adhesive layer 6, and the adhesive sheet 8 adhered to the developer medium 1 is superposed over medium 5 such that the other surface of the adhesive layer 6 is contacted with the surface of the medium 5, and then they are supplied with pressure and heat by a pair of heat rollers 51 as shown in FIG. 6, whereby the adhesive layer 6 is softened again and adhered to the medium 5. Finally, the substrate 2 is peeled from the developer medium 1 to transfer only the developer material layer having the visible image onto the medium 5.

In this embodiment, the heat roller 51 is driven at a speed of 10 mm/sec and at a temperature of 130° C. The heating means is not limited to this heat roller, but any heating means such as a heat plate also may be used.

Next, a second embodiment of the present invention will be described. The second embodiment uses the same developer medium, photosensitive and pressure-sensitive recording medium, and adhesive sheet as shown in FIGS. 1, 2 and 5 of the first embodiment, so that the same explanation is not repeated. The same or corresponding elements are represented by the same numerals as in the first embodiment.

Figure 7:
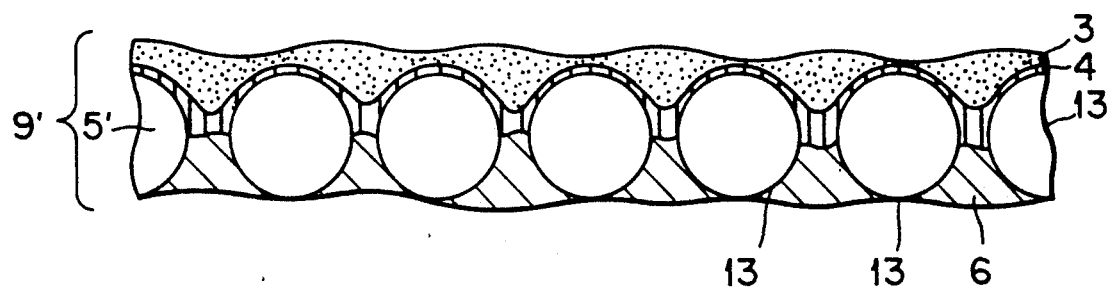
FIG. 7 is an enlarged cross-sectional side view showing an image which is finally formed on a cloth by a second embodiment of the present invention.

The second embodiment is remarkably effective to produce the image on a porous sheet such as cloth, texture, woven material, netted sheet, and the like. FIG. 7 is an enlarged cross-sectional view of the image transfer product 9' in which an image-supporting sheet 5' is a cotton cloth in a plain fabric. In FIG. 7, numeral 13 denotes a cotton string which is interposed between the developer material layer 4 covered with the thermoplastic resin layer 3 as the upper layer and the adhesive layer 6 as the lower layer.

A visible image is formed on the developer material layer 4 of the developer medium 1 in the same manner as shown in FIG. 3. The transferring process of this embodiment is carried out by forming an image transfer product 9' as shown in FIG. 7 in which the developer material layer 4 is provided to one surface of the cloth 5', and the adhesive layer 6 is provided to another surface of the cloth 5'. The image transfer product 9' is formed as follows.

Figure 5:
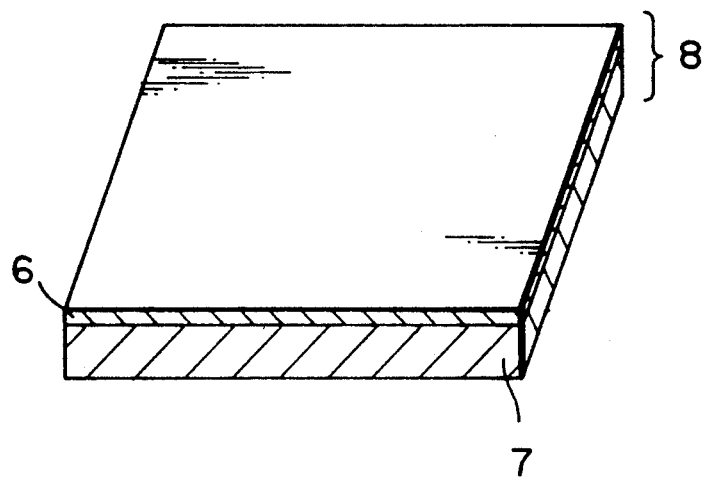
FIG. 5 is a schematically perspective view showing an adhesive sheet used in the present invention.
Figure 6:
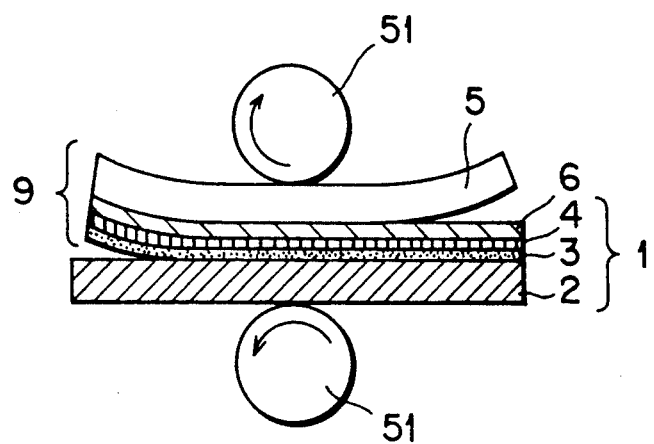
FIG. 6 is a cross-sectional side view showing an image transfer process for transferring a visible image from the developer medium to any type of medium according to the first embodiment of the present invention.

The developer material layer 4 having a visible image formed thereon by the manner as shown in 3 is superposed over the obverse surface of the cloth 5' on which the visible image is finally supported, and the reverse surface of the cloth 5' is further superposed over the adhesive layer 6 of the adhesive sheet 8 as shown in FIG. 5. Thereafter, they are supplied with pressure and heat. If binder is mixed in the developer material layer 4, the developer material and the binder are melted and adhered to the obverse surface of the cloth 5' in this heating and pressuring process. Further, the adhesive layer 6 is also softened and adhered to the rear surface of the cloth 5'. Thereafter, the substrate 2 and the base sheet 7 are respectively peeled from the developer medium 1 and the adhesive sheet 8. As a result, the image transfer product 9' including the cloth 5' provided with the developer material layer 4 on one surface thereof and the adhesive layer 6 on the other surface thereof is obtained as shown in FIG. 7. The adhesive layer 6 can adhere to the developer material layer 4 through each fine gap defined between the cotton strings 13. The image recorded layer; i.e., the developer material layer 4 is firmly scaled between the thermoplastic resin layer 3 and the adhesive layer 6 to protect the recorded image.

In the second embodiment, the heating and pressing means can be selected from a heat roller, a hot plate, a hot press, and the like.

The composition and producing method of the photosensitive and pressure-sensitive recording medium used in the first and second embodiments will be next described.

As shown in FIG. 2, the photosensitive and pressure-sensitive recording medium 10 includes the substrate 12 on which the microcapsules 11 are coated. The microcapsule 11 includes mainly photo-curing resin, photo-polymerization initiator, and chromogenic material.

The photo-curing resin is selected from ethylene glycol diacrylate, ethylene glycol dimethacrylate, trimethylol propane triacrylate, and diethylene glycol dimethacrylate. The photo-polymerization initiator is selected from $\alpha$-alkoxy phenylketone, polycyclic quinone, benzophenone, substituted benzophenone, xanthone, and thio-xanthone. The chromogenic material is selected from the compounds having lactone, lactam or spiropirane structure such as tri-arylmethane compounds, bisphenyl methane compounds, and the like; for example, crystal violet lactone and benzoyl leuco methylene blue.

The microcapsule 11 is produced by any conventional method such as a coacervation method and an interfacial polymerization method. The liquid material in the microcapsule 11 is composed of the photo-curing resin 50 parts, the chromogenic material 3 parts, the photopolymerization initiator 2.5 to 4 parts, photosensitizer 10 wt percent of the polymerization initiator, and binder and plasticizer respectively 1 part or less as required.

The composition and the producing method of the developer medium 1 will be briefly described.

The substrate 2 of the developer medium 1 is selected from the sheet material with a smooth and good lubricative surface such as polyester film, polyethylene film, polypropylene film, and the like. The thickness of the substrate 2 is 50 to 200 microns, preferably 100 microns.

The developer material of the developer material layer 4 can be selected from any types of developer materials used for conventional photosensitive and pressure-sensitive medium. For example, inorganic acidic materials such as acid clay, activated clay, kaolin and so on; phenol group compounds such as P-phenylphenol; aromatic carboxylic acid group compounds such as salicylic acid, gallic acid, propyl tannic acid, and so on; are used alone or in combination thereof. Further, the developer material optionally includes binder at any mixing ratio as necessary.

The thermoplastic resin layer 3 is selected from the resin which is softened or melted by heating and cured by cooling. For example, vinyl resin such as vinyl alcohol/vinyl acetate copolymer, polyvinyl chloride, vinyl chlo ride copolymer, vinyl acetate copolymer; acrylic resin such as ethyl acrylate, butyl acrylate, cyano methyl acrylate and so on; stylene resin; polyamide resin; wax are used.

The first and second embodiments of the present invention used a polyethylene terephthalate film of 75 microns in thickness for the substrate 12 of the developer medium 1, and a mixture of a stylene acrylic resin and polyester for the thermoplastic resin layer 3.

For the developer material layer 4, the first embodiment used acid clay, bisphenol A, and P-phenylphenol; and the second embodiment used zinc salicylate, bisphenol A, and P-phenylphenol.

The producing method for the developer medium 1 will be described.

In order to provide the thermoplastic resin layer 3, 50 wt % stylene-acryl copolymer emulsion (1000 cps) and 45 wt % polyester solution (500 cps) are mixed, and the mixed solution is coated on a polyethylene terephthalate film of 75 microns in thickness. The coated film is dried in an oven at 110° C. for 1 min. After drying, the thickness of the coated layer is 10 μm. Next, acid clay (zinc salicylate in the second embodiment) 50 parts, bisphenol A 30 parts, P-phenylphenol 30 parts are dispersed in polyvinyl alcohol aqueous solution 60 parts (120 parts in the second embodiment). This developer material dispersed solution is coated on the dried thermoplastic resin layer 3. The coated layer is dried in an oven at 80° C. for 1 min. After drying, the thickness of the coated developer material layer is 15 microns.

The base sheet 7 of the adhesive sheet 8 is selected from any plastic films, paper sheets or the like which are not deformed by heat from the heat roller. A polyethylene terephthalate film is preferable. For the adhesive layer 6, vinyl resin such as vinyl alcohol-vinyl acetate copolymer, polyvinyl chloride, vinyl chloride vinyl acetate copolymer; acrylic resin such as polyethyl acrylate, polybutyl methacrylate, polycyano methyl acrylate and so on; stylene resin; polyamide resin; wax are used.

In the first and second embodiments, a silicon treated polyethylene terephthalate film was used for the base sheet 7 of the adhesive sheet 8; and for the adhesive layer 6, the mixture of wax 10 parts, ethylene-vinyl acetate copolymer 10 parts, and resin ester 2 parts was coated on the base sheet 7 by a hot melt applicator.

The materials for the present invention are not only limited to the first and second embodiments, but any materials also can be used. However, the materials to be used in the present invention to preferable to satisfy the following conditions.

1. The adhesive strength between the adhesive layer 6 and the base sheet 7 of the adhesive sheet 8 is smaller than that between the substrate 2 of the developer medium 1 and the thermoplastic resin layer 3; between the thermoplastic resin layer 3 and the developer material layer 4; and between the developer material layer 4 and the adhesive layer 6.

2. The adhesive strength between the substrate 2 of the developer medium 1 and the thermoplastic resin layer 3 is smaller than that between the thermoplastic resin layer 3 and the developer material layer 4; between the developer material layer 4 and the adhesive layer 6; and between the adhesive layer 6 and any type of medium 5 to be recorded with the image.

As described above, the image transfer type recording method according to the present invention can eliminate the troubles such as complicated work, damage and scratch which are often caused at various peeling processes in conventional transfer type recording methods. The present invention can easily, smoothly and quickly record the visible image on ordinary sheets such as plain paper, post card, cloth, plastic sheet, and the like. Further, the invention can transfer the visible image by a heating means at a relatively low temperature, thus this will make the temperature control system for the recording process simple and reduce the cost of producing the recorded material. The finally recorded image produced by the invention possesses durability against scratching and tearing forces, and improved in weatherability.

Although the invention has been described in its preferred form, it is understood that the present disclosure of the preferred form can been changed without departing from the spirit and scope of the appended claims. For example, the preferred embodiment teaches that the adhesive layer 6 is adhered to the developer medium 1, while one modification may suggest that the adhesive sheet 8 is previously adhered to the ordinary sheet 5 and the base sheet 7 is peeled while keeping the adhesive layer 6 in fixing on any type of medium 5.

What is claimed is:

1. An image transferring medium comprising:
   a substrate;
   a thermoplastic resin layer formed on said substrate;
   a developer material layer formed on said thermoplastic resin layer and containing a visible image formed through a color-reaction with a chromogenic material; and
   an adhesive layer formed on said developer material layer.

2. The image transferring medium of claim 1, wherein said substrate is selected from the group consisting of polyester film polyethylene film, and polypropylene film.

3. The image transferring medium of claim 2, wherein said substrate has a thickness in the range from 50-200 micron.

4. The image transferring medium of claim 1, wherein said developer material layer is selected from the group consisting of inorganic acidic materials, phenol group compounds, aromatic carboxylic acid group compounds, and mixtures thereof.

5. The image transferring medium of claim 1, wherein said thermoplastic resin layer is heat melting.

6. The image transferring medium of claim 5, wherein said thermosplastic resin layer is selected from the group consisting of vinyl resin, acrylic resin, stylene resin, polyamide resin, and wax.

7. The image transferring medium of claim 1, wherein said adhesive layer is selected from the group consisting of vinyl resin, acrylic resin, stylene resin, polyamide resin, and wax.

8. The image transferring medium of claim 1, wherein:
   said substrate is a polyethylene terephthalate film;
   said thermoplastic resin layer is a mixture of stylene acrylic resin and polyester;
   said developer material is one of a mixture of acid clay, bisphenol A, and P-phenylphenol, and a mixture of zinc salicylate, bisphenol A and P-phenylphenol; and
   said adhesive layer is a mixture of 10 parts wax, 10 parts ethylene-vinyl acetate copolymer and 2 parts resin ester.

9. The image transferring medium of claim 1, wherein an adhesive strength between said substrate and said thermoplastic resin layer is smaller than an adhesive strength between said thermoplastic resin layer and said developer material layer, and between said developer material layer and adhesive layer.

* * * * *